(12) United States Patent
Holcomb

(10) Patent No.: US 9,003,648 B2
(45) Date of Patent: Apr. 14, 2015

(54) METHODS TO PRODUCE HIGH DENSITY, MULTILAYER PRINTED WIRING BOARDS FROM PARALLEL-FABRICATED CIRCUITS AND FILLED VIAS

(75) Inventor: Ken Holcomb, San Diego, CA (US)

(73) Assignee: Ormet Circuits, Inc., San Diego, CA (US)

( * ) Notice: Subject to any disclaimer, the term of this patent is extended or adjusted under 35 U.S.C. 154(b) by 1464 days.

(21) Appl. No.: 12/521,558

(22) PCT Filed: Dec. 28, 2007

(86) PCT No.: PCT/US2007/026460
§ 371 (c)(1),
(2), (4) Date: May 24, 2010

(87) PCT Pub. No.: WO2008/105867
PCT Pub. Date: Sep. 4, 2008

(65) Prior Publication Data
US 2010/0230145 A1      Sep. 16, 2010

Related U.S. Application Data

(60) Provisional application No. 60/883,114, filed on Jan. 2, 2007.

(51) Int. Cl.
*H05K 3/36* (2006.01)
*H05K 3/46* (2006.01)
(Continued)

(52) U.S. Cl.
CPC ............. *H05K 3/4614* (2013.01); *H05K 3/386* (2013.01); *H05K 3/4069* (2013.01); *H05K 3/4602* (2013.01); *H05K 3/462* (2013.01); *H05K 3/4652* (2013.01); *H05K 2201/0195* (2013.01);
(Continued)

(58) Field of Classification Search
USPC ......... 29/592.1, 825, 829, 830; 361/736, 784; 174/257, 256, 250, 68.1; 156/252, 156/272.8
See application file for complete search history.

(56) References Cited

U.S. PATENT DOCUMENTS

| 4,642,160 A | 2/1987 | Burgess |
| 4,645,733 A | 2/1987 | Sullivan |
| 4,802,951 A | 2/1989 | Clark et al. |

(Continued)

FOREIGN PATENT DOCUMENTS

| EP | 0568930 | 3/1998 |
| JP | 10-190159 | 7/1998 |

(Continued)

OTHER PUBLICATIONS

International Search Report for PCT Application No. PCT/US2007/026460.

(Continued)

*Primary Examiner* — Peter DungBa Vo
*Assistant Examiner* — Azm Parvez
(74) *Attorney, Agent, or Firm* — The Law Office of Jane K. Babin, Professional Corporation; Jane K. Babin

(57) ABSTRACT

The invention provides methods to mass laminate and interconnect high density interconnect circuit layers fabricated through parallel processing. Invention methods employ an inside-out interconnection strategy that eliminates plating of vias and provides defect-free outer circuit layers. Conductive paste and via layers are also key features of the invention.

2 Claims, 1 Drawing Sheet

(51) Int. Cl.
   *H05K 3/38*   (2006.01)
   *H05K 3/40*   (2006.01)

(52) U.S. Cl.
   CPC ............... *H05K2201/0394* (2013.01); *H05K 2201/10378* (2013.01); *H05K 2203/061* (2013.01)

(56) References Cited

U.S. PATENT DOCUMENTS

| | | | |
|---|---|---|---|
| 4,897,338 A | 1/1990 | Spicciati et al. | |
| 4,921,777 A | 5/1990 | Fraenkel et al. | |
| 5,948,533 A | 9/1999 | Gallagher et al. | |
| 6,085,415 A | 7/2000 | Gandhi et al. | |
| 6,281,448 B1 | 8/2001 | Tsukamoto | |
| 6,534,723 B1 * | 3/2003 | Asai et al. | 174/255 |
| 6,594,152 B2 * | 7/2003 | Dent | 361/785 |
| 6,673,190 B2 | 1/2004 | Haas et al. | |
| 7,169,209 B2 | 1/2007 | Nakata et al. | |

FOREIGN PATENT DOCUMENTS

| | | | |
|---|---|---|---|
| JP | 10190159 A * | 7/1998 | H05K 1/02 |
| JP | 2001326458 | 11/2001 | |
| JP | 2001326458 A * | 11/2001 | H05K 3/38 |

OTHER PUBLICATIONS

Japanese Office Action (and English translation) dated Jun. 12, 2012 in Japanese Patent Application No. 2009-544859.

* cited by examiner

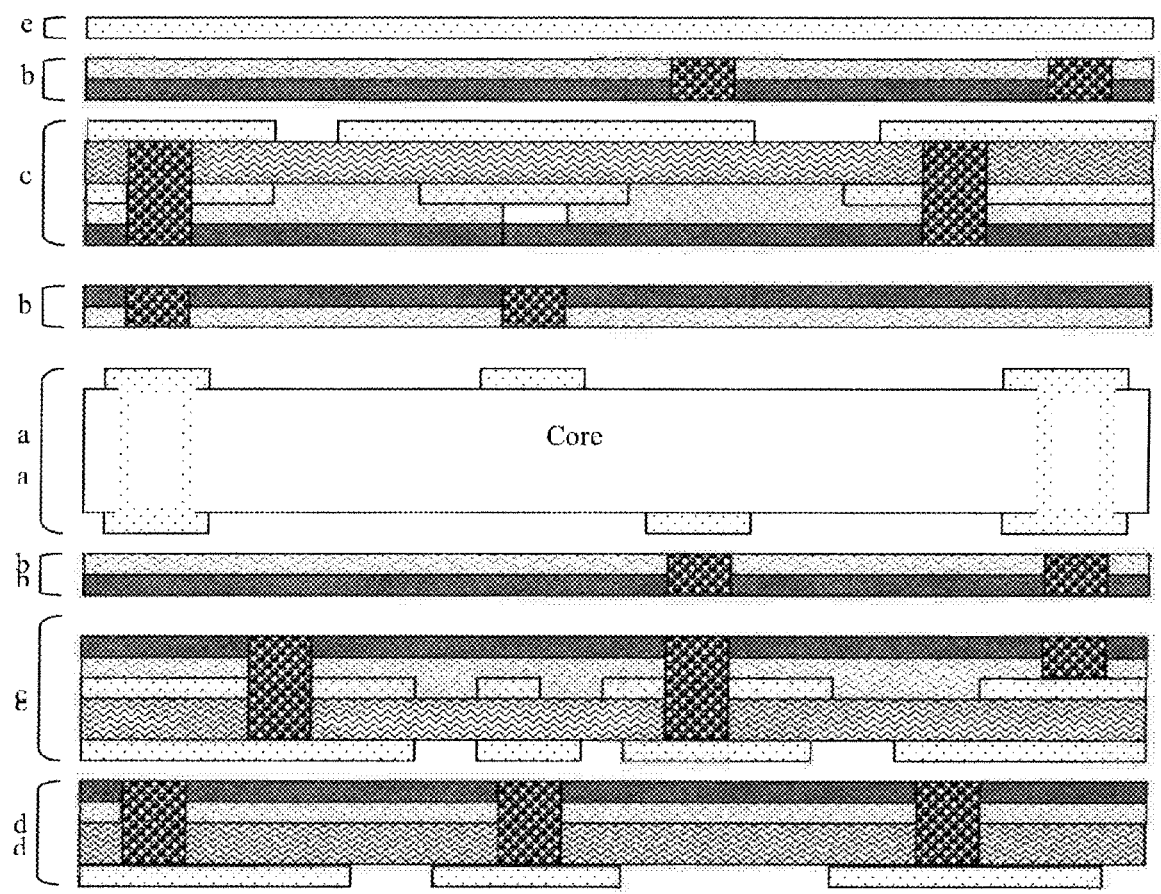

METHODS TO PRODUCE HIGH DENSITY, MULTILAYER PRINTED WIRING BOARDS FROM PARALLEL-FABRICATED CIRCUITS AND FILLED VIAS

RELATED APPLICATIONS

This application is the U.S. National Phase of PCT Application No. PCT/US2007/026460, filed Dec. 28, 2007, entitled "Methods To Produce High Density, Multilayer Printed Wiring Boards From Parallel-Fabricated Circuits and Filled Vias, which claims priority to U.S. Provisional Application No. 60/883,114, entitled "Methods to Produce High density, Multilayer Printed Wiring Boards From Parallel-Fabricated Circuits and Filled Vias", filed Jan. 2, 2007, the entire contents of which are hereby incorporated by reference herein.

FIELD OF THE INVENTION

The invention described herein relates to methods for the manufacture of high-density multilayer circuits. The invention method achieves interconnection between circuit layers in such a way that enables parallel processing of circuit and interconnect layers.

BACKGROUND OF THE INVENTION

High-density-interconnect (hereinafter: HDI) multilayer circuits are an extremely large and fast-growing segment of the printed circuit board industry. In most of these HDI multilayer circuits, high circuit density is only required in the outermost layers. Conventional processes to form HDI circuit layers are sequential—connections between layers are formed from the outer layer to the inner layer. The fine features required and the typically "outside-in" methodology for layer-to-layer connection necessitates an extensive list of precision and often expensive process steps for each layer. The chemical baths needed to electroless plate copper into the layer-to-layer interconnections (hereinafter referred to as vias) are particularly expensive to install, operate and maintain. Therefore, to conserve cost, a relatively low-circuit-density multilayer circuit "core" is fabricated by conventional, relatively low-cost, methods, and HDI layers are added to either side as required. Typically, the low-circuit-density core consists of etched copper circuits separated by polymer laminate sheets and interconnected by copper-plated through-holes.

Conventional, prior art methods for manufacture of the HDI circuit layers are generally sequential processes. Most typically, copper foil and polymer dielectric are laminated to both sides of a low-circuit-density core. Formation of the electrical interconnections between the outer- and immediately underlying inner-layer follows, and then the definition of the outer-layer circuit pattern is undertaken. Most commonly, the pattern of via holes is formed in the copper foil by a common photolithography-etching method. Once the polymer dielectric is exposed in the areas of the via holes, the polymer dielectric is laser ablated down to the underlying copper pad on the outermost layer of the low-circuit-density core. The via holes thus formed are electroless and electrolytically plated and the pattern of the surface circuitry is etched by depositing and photolithographically defining a photopolymer mask and chemically etching away the exposed copper foil. Any additional HDI circuit layers are produced similarly, in a sequential process scheme.

This conventional methodology for producing HDI multilayer circuits suffers from several limitations. The plating operations are slow, expensive and require complicated chemistry. The via connections thus created have a residual 'dimple' that can distort overlying circuitry and entrap contaminants. Because the vias are not typically solidly filled, they cannot be vertically stacked to create interconnection across several layers without additional filling operations. Also due to uneven topography, the vias cannot generally be located in component attachment pads without additional filling operations because the connection of the component may be compromised. Even when filled, the dimples are a common source of failure due to evolution of entrapped volatiles or water during secondary processing operations. Further, the connection between the barrel of the via and the over- and underlying-circuitry is located at points of high mechanical stress due to coefficient of thermal expansion mismatch with the polymer dielectric. Finally, the sequential nature of the process is slow and a defect in late stages of processing creates substantial losses in the near-finished assembly.

The deficiencies of current methods for manufacture of HDI multilayer circuits can thus be summarized as follows:

- current methods rely on sequential processing, which is susceptible to cumulative yield loss, whereas parallel processing of HDI circuit layers, in contrast, would provide the opportunity to verify and use only "known good layers";
- vias used to electrically interconnect layers are formed from the outside-in, which creates defects in the outside layer of circuitry;
- via creation is also a sequential process that cannot be undertaken until the materials for the next HDI layer have been laminated to the core;
- conventional electroless and electrolytic methods to plate the vias are slow, complex and expensive;
- plated vias suffer from concentrated areas of mechanical stress that are susceptible to failure; and
- the residual dimple in plated vias can entrap contaminants, distort outer layers, inhibit the creation of via stacks, and can interfere with secure component attachment when the via is located in the pad.

Some prior art methods have sought to overcome these deficiencies. For example, the methods of Gallagher et al, U.S. Pat. No. 5,948,533, teach the use of layers of conductive-compound-filled vias in patterned polymer dielectric materials (hereinafter: via layers) to connect circuit layers. The use of such methods enables a parallel-fabricated via layer and copper sheet to be laminated to either side of a conventionally processed core. This eliminates the deficiencies of sequentially produced vias, copper plating of vias and surface layer defects. Additional layers must still, however be added sequentially. In an alternative embodiment, via layers can be used to interconnect and conjoin a core and a multiplicity of parallel-fabricated two-sided HDI circuits with plated through-connections in a single lamination. While this method provides a means to parallel-fabricate all circuit and via layers, the via connections between the two sides of the two-sided circuits must still be plated.

Several other prior art methods employ similar strategies, but with variations in the material used as the electrically conductive compound (e.g. Tsukamoto, U.S. Pat. No. 6,281,448; Haas et al, U.S. Pat. No. 6,673,190).

While these publications describe substantial improvements in the art, these prior art methods do not completely remedy the deficiencies of sequential processing (when single-sided or adhesive sheet plus foil strategies are employed) or plated vias (when two-sided HDI circuits are employed).

SUMMARY OF THE INVENTION

In accordance with the present invention, there are provided elegant, versatile, cost-effective and highly manufacturable methods to mass laminate a wide assortment of parallel-fabricated circuit layers into a multilayer circuit structure. Invention methods remedy all of the aforementioned deficiencies in prior art methods to manufacture HDI multilayer-circuits.

While invention methods, like prior art methods, can use a conventional multilayer circuit core to keep overall production costs low, a significant difference lies in how the high-density circuit layers are produced and interconnected. Thus, the invention, in all of its possible permutations, encompasses aligning and laminating a plurality of parallel-fabricated layers, wherein each layer comprises at least two of the following elements:

- a multilayer circuit core,
- adhesive sheets containing a pattern of via holes filled with an electrically conductive compound,
- a polymer dielectric material bearing high-density circuitry on either side that is attached to an adhesive sheet, and contains a pattern of via holes filled with an electrically conductive compound that extends through both the adhesive sheet and the polymer dielectric,
- a polymer dielectric material bearing high-density circuitry on one side that is attached to an adhesive sheet, and contains a pattern of via holes filled with an electrically conductive compound that extends through both the adhesive sheet and the polymer dielectric, and
- a sheet of copper foil.

Also provided in accordance with the present invention are high-density multilayer circuits prepared employing invention methods.

BRIEF DESCRIPTION OF THE FIGURE

FIG. 1 presents a schematic representation of a high-density multilayer circuit prepared employing invention methods. In the FIGURE:
- areas with black dots on a white background represent copper plating or foil,
- areas with dark wavy lines on a white background represent fully cured polymer dielectric (e.g. FR4 laminate),
- areas with light wavy lines on a white background represent partially cured adhesive (e.g. FR4 prepreg),
- areas with checkerboard shading represent a polymer sheet used as temporary tooling,
- areas with black spheres on a white background represent conductive compound filled into via holes, and
- the boxed white area labeled "core" represents a double-sided or multi-layered circuit core with relatively low circuit density.

Sections of FIG. 1 labeled (a) represent a multilayer circuit core with patterned copper on both faces and copper plated through-holes extending through and electrically interconnecting the circuit layers of the structure.

Sections of FIG. 1 labeled (b) represent a polymer adhesive layer that is temporarily affixed to a polymer sheet, wherein the structure formed thereby has been selectively perforated to form vias, and such vias have been filled with an electrically conductive compound.

Sections of FIG. 1 labeled (c) represent a two-sided HDI circuit that has been affixed to an adhesive sheet bearing a temporarily affixed polymer sheet on the face of the HDI circuit that will reside closest to the core, wherein the structure formed thereby has undergone selective removal of material to form blind (terminated at the outer copper layer) vias, and such vias have been filled with an electrically conductive formulation that extends through the polymer mask, adhesive sheet and the polymer dielectric.

Sections of FIG. 1 labeled (d) represent a single-sided HDI circuit affixed to an adhesive layer bearing a temporarily affixed polymer sheet on the side of the HDI circuit not bearing circuitry, wherein the structure formed thereby has undergone selective removal of material to form blind (terminated at the outer copper layer) vias, and such vias have been filled with an electrically conductive formulation that extends through the polymer mask, adhesive sheet and the polymer dielectric.

Sections of FIG. 1 labeled (e) represent a sheet of copper foil.

DETAILED DESCRIPTION OF THE INVENTION

In accordance with the present invention, there are provided methods to produce high-interconnect-density multilayer circuits, said methods comprising:

aligning and laminating a desired multiplicity of parallel-fabricated sub-constructions, wherein each of said sub-constructions comprise at least two of the following elements:
- (a) a multilayer circuit core;
- (b) adhesive sheets temporarily affixed to a polymer mask, wherein the structure formed thereby has been selectively perforated to form vias, and such vias have been filled with an electrically conductive paste;
- (c) a polymer dielectric material bearing high-density circuitry on either side that is attached to an adhesive sheet bearing a polymer mask, wherein the structure formed thereby has undergone selective removal of material to form blind (terminated at the outer copper layer) vias, and such vias have been filled with an electrically conductive formulation that extends through the polymer mask, adhesive sheet and the polymer dielectric;
- (d) a polymer dielectric material bearing high-density circuitry on one side that is attached to an adhesive sheet bearing a polymer mask, wherein the structure formed thereby has undergone selective removal of material to form blind (terminated at the outer copper layer) vias, and such vias have been filled with an electrically conductive formulation that extends through the polymer mask, adhesive sheet and the polymer dielectric; and
- (e) a sheet of copper foil;

wherein the multiplicity of sub-constructions is selected so as to form the desired high-interconnect-density multilayer circuit.

Also provided in accordance with the present invention are high-interconnect-density multilayer circuits produced employing the above-described methods.

Most multilayer circuit boards that require HDI circuitry only need the high circuit density on the outer, or signal redistribution layers. The need for high circuit density signal redistribution layers is driven by the very large number of connections from attached semiconductor devices. The tightly packed connections from the semiconductor devices are typically fanned out over the surface of the circuit board so that individual components might interact with one another. The underlying circuit layers, typically power and ground layers, do not generally require such high circuit density. These lower circuit density requirements can be met very cost-effectively by fabricating a double-sided or multilayer circuit "core" according to common prior art methods (see, for example, U.S. Pat. Nos. 4,921,777, 4,897,338, 4,642,160, and 4,645,733, the contents of each of which are hereby incorporated by reference herein in their entireties).

Typically prior art methods for fabricating a double-sided or multilayer circuit "core" use a parallel-fabrication approach. For example, a polymer laminate bearing copper foil on each side can be coated with a photodefinable polymer on both copper foils. The photodefinable polymer is selectively irradiated and developed to form a mask in the desired circuit pattern. The copper foil exposed through the mask is etched away, and the photopolymer is stripped from the copper surface to yield the desired copper circuit pattern on both sides of the laminate. Once completed, circuit layers thus produced can be interleaved with adhesive polymer dielectric sheets (e.g. prepreg), aligned and laminated to form a multilayer circuit.

The resulting laminated construction can then be drilled at the points of desired interconnection between layers and the drilled holes plated with copper after a series of preparation steps. Because the drilled holes typically extend through the entire construction, a significant amount of surface area is wasted for circuit layers not requiring interconnection at that point. Unlike HDI circuit layers, in low-density circuits, this waste of space is typically not problematic. This type of construction can be made relatively inexpensively as long as:

the total circuit layer count is low (generally less than 6, although it can be substantially more), the hole sizes are relatively large (typically greater than 20 mil), and the circuit patterns are relatively simple (greater than 10 mil lines and spaces).

In accordance with one aspect of the present invention, the use of conventionally produced multilayer circuit cores as described herein, is contemplated, although such cores are not required to produce multilayer circuits employing invention methods. Invention methods take advantage of the discovery that parallel fabrication methods can be used in not only the construction of the core, but also for the construction of the in-plane circuitry and vertical interconnection of the HDI circuit layers added to the core. In addition, invention methods eliminate the deficiencies of plated holes.

In one embodiment of the present invention, element (b) is formed by:
(i) providing the adhesive sheet temporarily affixed to a protective polymer mask,
(ii) creating the pattern of holes through both the adhesive sheet and temporary polymer mask,
(iii) filling the holes with a suitable electrically conductive compound, and
(iv) removing the polymer mask.

In accordance with another embodiment of the present invention, element (c) and/or (d) is formed by:
(i) providing the adhesive sheet temporarily affixed to a polymer mask;
(ii) either simultaneously or subsequently adhering the polymer dielectric bearing high-density circuitry to the adhesive sheet on the side opposite to the polymer mask;
(iii) creating the pattern of holes through the polymer mask, the adhesive sheet, and the polymer dielectric;
(iv) filling the holes with a suitable electrically conductive compound; and
(v) removing the temporary polymer mask.

In accordance with yet another embodiment of the present invention, element (c) and/or (d) is formed by:
(i) providing the adhesive sheet temporarily affixed to a polymer mask;
(ii) creating a pattern of holes through said adhesive sheet and said polymer mask;
(iii) providing the polymer dielectric bearing high-density circuitry on one or both faces;
(iv) creating a pattern of holes corresponding to those created in step (ii) in said polymer dielectric such that said holes extend from the surface of said polymer dielectric that will reside closest to the core or innermost element and terminate at the high-density circuit on the opposing surface;
(v) aligning said adhesive sheet with said polymer dielectric such that said pattern of holes in each are co-located, and such that said polymer mask is on the opposing surface of said adhesive sheet from said polymer dielectric;
(vi) tack laminating the construction created in step (v) to form a single entity;
(vii) filling the aligned holes in the entity created in step (vi) with a suitable conductive compound such that said conductive compound extends through said polymer mask, said adhesive sheet and said polymer dielectric and is in intimate contact with said high-density circuit,
(viii) removing said polymer mask.

With respect to elements (b), (c) and (d) above, the adhesive sheet serves as a vehicle for providing vertical interconnection between layers. The adhesive sheet is temporarily affixed to a polymer mask that serves as a stencil during deposition of the electrically conductive compound. The adhesive sheet, with polymer mask temporarily affixed, can be selectively perforated as a free-standing entity, or affixed to the core-facing side of the high-density circuit layer prior to the formation of via holes. Creation of the vias can be performed by laser ablation, or when the masked adhesive sheet is free-standing, by punching, or mechanically drilling. In the instance when the masked adhesive sheet is affixed to the high-density circuit, the vias are laser-drilled through the polymer mask, the adhesive sheet, and the polymer dielectric, terminating at the opposing copper layer.

In an alternative embodiment, vias can be formed in the free-standing adhesive sheet with temporarily affixed polymer sheet by laser ablation, mechanical drilling, or punching, the corresponding blind via holes are formed in the HDI circuit in a separate laser ablation operation, and then the adhesive sheet and HDI circuit are affixed by low temperature lamination prior to filling the via holes with conductive compound. By forming the holes in each element independently, the most efficient via hole formation technique can be used for each type of element.

All conventional polymer-based dielectric materials are contemplated for use as the adhesive sheet provided that they have good adhesion to common circuit materials, are dimensionally stable, and will form said good adhesion during lamination cycles typical to the industry. Some examples of materials that would be appropriate for use as the adhesive sheet include, but are not limited to: epoxy prepreg, cyanate ester prepreg, Pyralux (Dupont), resin impregnated aramid fiber paper (e.g. Thermount), JADE, and Speedboard (Gore).

Materials that would be appropriate for use as the polymer mask include, but are not limited to, all film-type polymers that would be non-reactive with the adhesive sheet (e.g. Mylar, polyimide, PET). Alternative materials, such as metallic foils or coated papers, may also be suitable for use as a temporarily affixed mask. For optimal results, the polymer mask should require similar laser intensity levels as the adhesive sheet for ablation of the via holes.

The polymer mask is typically affixed to the adhesive sheet using such equipment as vacuum lamination equipment, a lamination press, a roll laminator, or the like. The temperature at which the polymer mask is affixed is preferably the minimum necessary to render the adhesive tacky, typically 75-100° C., so that no significant advancement in the cure of the adhesive occurs. Likewise, any applied pressure is preferably minimal so as to minimize displacement of the resin in the adhesive sheet.

Once applied, the polymer sheet may remain affixed to the adhesive sheet until all of the elements are ready for lamination into a multilayer circuit. Retaining the cover sheet throughout the handling operations prior to lamination may offer some protection to the deposited conductive compound from smearing and similar defects. In some cases, however, it may be advantageous to remove the polymer mask shortly after filling the vias with the conductive compound so that the portion of the conductive compound deposit extending through the polymer sheet separates cleanly from the polymer sheet. One of skill in the art can readily determine the point after depositing the conductive compound at which the polymer sheet is most advantageously removed, which is typically predicated on such factors as the selection of conductive compound, polymer sheet and adhesive sheet materials.

The conductive composition contemplated for use in the practice of the present invention can be any material that is deposited as a paste and will process under typical industry lamination conditions to form an electrically conductive pathway between the circuit pads. Presently preferred compositions include those described in U.S. Pat. No. 5,948,533 (incorporated by reference herein in its entirety) because of the metallurgical connection formed to the copper pads by such compositions. Indeed, these compositions have many characteristics which render them desirable for use in the invention methods. For example, the electrical conductivity of these compositions is superior to the known conductive polymer thick films. Electrically conductive polymer thick films generally incorporate high levels of silver or copper particles into a thermosetting or thermoplastic resin binder and rely upon mechanical contact of these particles to carry electrical current. The preferred compositions employ a high melting point metal and a relatively low melting point alloy which together undergo a process known as transient-liquid-phase sintering (TLPS) to form true metallurgical joints between the metal particles and to the adjacent copper pads.

In ceramic technology, sintering is used to fabricate wiring in multilayer substrates. This technique, however, typically requires process temperatures in excess of 700° C. to eliminate the organic binder and reduce the metal oxides for complete densification. In contrast, several metallurgical systems can undergo TLPS at temperatures well below 350° C. TLPS is characterized by raising a low melting point metal or alloy to its melting temperature at which time it diffuses into a higher melting point metal or alloy. The new alloy thus formed solidifies as it is created and has an entirely new melting point. Judicious choice of metals employed in the TLPS process can allow for a composition that will remelt at substantially higher temperatures than the melting point of the original low melting point alloy. This property allows multilayer circuit constructions created by the invention methods to withstand soldering operations without re-melting the originally formed metal matrix in the composition.

The adhesion properties, mechanical integrity, and corrosion resistance of high-interconnect-density multilayer circuits prepared employing metallurgical systems which can undergo TLPS are far superior to those prepared employing prior art compositions, because there is no need to add aggressive fluxing agents. The compositions based on metallurgical systems which can undergo TLPS are fully cross-linked, and all components thereof are chemically immobilized upon curing. Even the reaction by-products of the flux de-oxidation of the metals behave as though they are chemically bound in the polymer matrix. Accordingly, such compositions are ideally suited for creating the vertical interconnection between copper circuit layers.

Other particularly suitable compositions may be formed from the particles described in U.S. Pat. No. 7,169,209 (Nakata et al; incorporated by reference herein in its entirety). Such particles undergo TLPS within and between individual particles rather than through intermixing of particles of two or more metallic compositions.

The conductive composition may be applied by any of a variety of methods known to those of skill in the art, e.g., screen- or stencil-printing, doctor-blading, pressure-assisted squeegee, and the like. The temporary polymer mask serves as a contact stencil during the filling operation and is removed prior to alignment and lamination of the layers.

High-density circuit layers contemplated for use herein can be formed using conventional etching methods known to those of skill in the art. The production of high-density circuits from copper-clad polymer laminates has become possible due to the relatively recent introduction of thin polymer laminates bearing thin copper foils. Standard, low-density circuits are etched from thick (0.030-0.060 inch) laminates bearing copper foil in ~0.001 inch thickness. The polymer laminates used for high-density layers are typically less than 0.020 inches thick and bear copper foils approximately 0.0004 inches thick. The thinner foils can be etched to create finer-dimensioned features than would be possible with conventional laminates. Any copper-clad laminate construction bearing copper appropriate for etching high-density circuits would be appropriate for use in the invention. Copper circuits bearing common alternative metal surface finishes would also be appropriate (e.g. gold, tin, OSP, adhesion promotion treatments) for use in the invention. For the laminate, materials considered for use would include all common flexible and rigid laminate printed circuit board dielectrics, or other such materials that would be readily contemplated by those of skill in the art.

Similarly, any polymer dielectric bearing an appropriate layer for etching high-density circuits would be contemplated for use in the invention. This would encompass resin-coated copper foils in which the resin was all c-staged (fully cured) or a combination of b-(partially cured) and c-staged would be contemplated for use in the invention. In the event that both b- and c-staged resin layers are present, the b-stage layer may substitute for the adhesive sheet.

Resin coated foil, polymer dielectric bearing high-density circuitry only on one side, and copper foil are all alternatives to providing odd numbers of high-density layers to the core. When employed, the resin-coated foil and copper foil thus applied would likely have to be etched subsequent to lamination.

Those of skill in the art can readily identify alignment and lamination techniques suitable for use in creating multilayer circuits according to the present invention. Indeed, those techniques typically employed in the art are also contemplated for use in creating multilayer circuits by the invention methods. Typically, tooling holes are formed in the individual element and tooling pins are used to align the elements. As readily recognized by those of skill in the art, some care must be exercised in the removal of the polymer sheet to ensure that features are not displaced or distorted by the process. In some cases, the materials selected may require particular attention to environmental control of the manufacturing operation due to dimensional changes produced in the adhesive or laminate materials with changes in temperature and humidity.

Lamination conditions and the preparation of the lamination booking materials are specific to the adhesive and laminate materials selected for use. For example, when invention methods are practiced with the conductive compounds described in U.S. Pat. No. 5,948,533, a peak lamination temperature of not less than about 190° C. and a lamination pressure of not less than about 275 psi are preferred.

The invention will now be described in greater detail with reference to the following non-limiting examples.

EXAMPLE 1

To evaluate whether or not adhesive sheet elements and HDI circuit elements could undergo separate hole formation operations and then be tacked together and filled appropriately, a test vehicle was designed. Via holes were laser ablated in a FR4 laminate bearing copper circuitry on one side. The via holes were ablated from the side opposite the copper circuit and terminated at the copper. The diameter of the laser ablated vias was approximately 6 mil. An FR4 prepreg was obtained and affixed to a Mylar sheet by vacuum lamination. The prepreg with affixed Mylar was mechanically drilled in a pattern of via holes corresponding to the pattern in the FR4 laminate. Because mechanical drilling is prohibitively expensive below 8 mil diameter holes, the via holes in the prepreg were 10 mil in diameter. The holes in the FR4 prepreg were visually aligned with the via holes in the laminate by sighting on the exposed copper. The aligned prepreg and laminate were tack laminated in a standard lamination press at 80° C. and a "kiss" pressure of less than 20 psi. After tack lamination, the alignment was rechecked and the conductive compound Ormet 7001 Ormet Circuits, Inc.) was deposited by doctor blade over the Mylar mask. After an initial filling, the construction was placed into a box oven set at 95° C. for 15 minutes to evaporate the solvent in the conductive compound and to release air entrapped by the filling operation.

A second filling operation was performed after this drying step so that all the via holes contained conductive compound flush with the Mylar surface. The Mylar sheet was removed by careful peeling from one corner of the construction and the construction was placed into a box oven set at 95° C. for 30 minutes to evaporate any remaining solvent. After completion of the drying cycle, a sheet of copper foil was placed onto the construction over the via holes and a lamination book was prepared:
  steel plate,
  release sheet,
  Pacopad,
  release sheet,
  foil-prepreg-laminate construction,
  release sheet,
  Pacopad,
  release sheet,
  steel plate.
The lamination book was placed into a lamination press set at 190° C. and the press was closed to an applied pressure of 300 psi. The lamination cycle was 60 minutes and the construction was removed while still hot. After the construction had cooled, cross sections were prepared.

When viewed under the microscope, alloyed interconnection could be observed to the upper and underlying copper and the via holes in both the prepreg and laminate were consistently filled. Electrical probing from one copper surface to the other indicated good electrical conduction through the vias and no sign of the buried filled vias could be observed on the copper surfaces.

EXAMPLE 2

To determine if the invention methods were suited to a typical manufacturing environment in which some elements may have to be stored for some time until all elements are ready for lamination, Ormet 7001 (U.S. Pat. No. 5,948,533) was doctor bladed into serpentine patterns recessed into a polymer coating on a FR4 laminate. Ten test samples were prepared by doctor-blading the Ormet 7001 into six serpentine patterns per test coupon, drying in a box oven set at 95° C. for 5 minutes, doctor-blading a second fill of Ormet 7001 perpendicular to the initial fill direction, and drying in the 95° C. box oven for an additional 30 minutes. One sample was processed immediately in a lamination press set at 190° C. at 300 psi for 30 minutes. The resistance of the serpentine patterns was measured and recorded. The remaining samples were left unprotected in an open shop environment and were processed according to the above lamination conditions at a rate of about one sample per week. At the conclusion of the study, there was no statistical difference between the samples in electrical resistance.

EXAMPLE 3

An experiment was performed to determine if affixing a Mylar sheet to prepreg materials significantly advanced the cure of the resin. The purpose of the experiment was to determine if affixing the Mylar would have a disadvantageous effect on the ability of the prepreg resin to properly flow and adhere the laminates. Differential scanning calorimetry was performed on a number of samples to determine the glass transition temperature thereof. The samples tested included:
  fresh prepreg,
  prepreg that had been in storage,
  fresh prepreg with an applied Mylar layer, and
  older prepreg with an applied Mylar layer.
A higher glass transition temperature is a sign of advancement of the resin cure.

Although a small degree of advancement was observed in samples with applied Mylar (generally <1° C.), it was less than the degree of advancement observed in the stored prepreg, compared to the fresh material (3-4° C.). Because the older prepreg material was still well within its proscribed shelf life, it was determined that application of the Mylar had no significant deleterious effect.

While the invention has been described in detail with reference to certain preferred embodiments thereof, it will be understood that modifications and variations are within the spirit and scope of that which is described and claimed.

What is claimed is:

1. A method to produce high-interconnect-density multilayer circuits, said method comprising:
  aligning and laminating a desired multiplicity of parallel-fabricated sub-constructions, wherein each of said sub-constructions comprise at least two of the following elements:
    (a) a multilayer circuit core;
    (b) adhesive sheets temporarily affixed to a polymer mask thereby forming a structure, wherein the structure has been selectively perforated to form vias, and such vias have been filled with an electrically conductive composition;

(c) a polymer dielectric material bearing high-density circuitry on either side that is attached to an adhesive sheet bearing a polymer mask thereby forming a structure, wherein the structure has undergone selective removal of material to form blind vias, and such vias have been filled with an electrically conductive composition that extends through the polymer mask, adhesive sheet and the polymer dielectric;

(d) a polymer dielectric material bearing high-density circuitry on one side that is attached to an adhesive sheet bearing a polymer mask thereby forming a structure, wherein the structure has undergone selective removal of material to form blind vias, and such vias have been filled with an electrically conductive composition that extends through the polymer mask, adhesive sheet and the polymer dielectric; and (e) a sheet of copper foil;

wherein element (c) and/or (d) is formed by:
  (i) providing the adhesive sheet temporarily affixed to a polymer mask;
  (ii) either simultaneously or subsequently adhering the polymer dielectric bearing high-density circuitry to the adhesive sheet on the side opposite to the polymer mask;
  (iii) creating a pattern of holes through the polymer mask, the adhesive sheet, and the polymer dielectric;
  (iv) filling the holes with a suitable electrically conductive composition; and
  (v) removing the temporary polymer mask wherein the multiplicity of sub-constructions is selected so as to form the desired high-interconnect-density multilayer circuit.

2. A method to produce high-interconnect-density multilayer circuits, said method comprising:

aligning and laminating a desired multiplicity of parallel-fabricated sub-constructions, wherein each of said sub-constructions comprise at least two of the following elements:

(a) a multilayer circuit core;

(b) adhesive sheets temporarily affixed to a polymer mask thereby forming a structure, wherein the structure has been selectively perforated to form vias, and such vias have been filled with an electrically conductive composition;

(c) a polymer dielectric material bearing high-density circuitry on either side that is attached to an adhesive sheet bearing a polymer mask thereby forming a structure, wherein the structure has undergone selective removal of material to form blind vias, and such vias have been filled with an electrically conductive composition that extends through the polymer mask, adhesive sheet and the polymer dielectric;

(d) a polymer dielectric material bearing high-density circuitry on one side that is attached to an adhesive sheet bearing a polymer mask thereby forming a structure, wherein the structure has undergone selective removal of material to form blind vias, and such vias have been filled with an electrically conductive composition that extends through the polymer mask, adhesive sheet and the polymer dielectric; and (e) a sheet of copper foil;

wherein element (c) and/or (d) is formed by:
  (i) providing the adhesive sheet temporarily affixed to a polymer mask;
  (ii) creating a pattern of holes through said adhesive sheet and said polymer mask;
  (iii) providing the polymer dielectric bearing high-density circuitry on one or both faces;
  (iv) creating a pattern of holes corresponding to those created in step (ii) in said polymer dielectric such that said holes extend from the surface of said polymer dielectric that will reside closest to the core or innermost element and terminate at the high-density circuit on the opposing surface;
  (v) aligning said adhesive sheet with said polymer dielectric such that the pattern of holes in the adhesive sheet and the pattern of holes in the polymer dielectric are co-located, and such that said polymer mask is on the opposing surface of said adhesive sheet from said polymer dielectric, thereby forming a construction;
  (vi) tack laminating the construction created in step (v) to form a single entity;
  (vii) filling the aligned holes in the entity created in step (vi) with a suitable conductive composition such that said conductive composition extends through said polymer mask, said adhesive sheet and said polymer dielectric and is in intimate contact with said high-density circuit, and
  (viii) removing said polymer mask wherein the multiplicity of sub-constructions is selected so as to form the desired high-interconnect-density multilayer circuit.

* * * * *